US007233518B2

(12) United States Patent
Liu

(10) Patent No.: US 7,233,518 B2
(45) Date of Patent: Jun. 19, 2007

(54) RADIATION-HARDENED SRAM CELL WITH WRITE ERROR PROTECTION

(75) Inventor: Harry Liu, Plymouth, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 11/051,916

(22) Filed: Feb. 4, 2005

(65) Prior Publication Data

US 2006/0176727 A1 Aug. 10, 2006

(51) Int. Cl.
*G11C 11/00* (2006.01)

(52) U.S. Cl. ........ 365/156; 365/154

(58) Field of Classification Search ........ 365/156
See application file for complete search history.

(56) References Cited

U.S. PATENT DOCUMENTS

| | | | | |
|---|---|---|---|---|
| 4,532,609 | A * | 7/1985 | Iizuka | 365/154 |
| 4,805,148 | A * | 2/1989 | Diehl-Nagle et al. | 365/154 |
| 4,912,675 | A * | 3/1990 | Blake et al. | 365/154 |
| 5,301,146 | A * | 4/1994 | Hama | 365/154 |
| 5,631,863 | A * | 5/1997 | Fechner et al. | 365/156 |
| 5,905,290 | A * | 5/1999 | Houston | 257/380 |
| 6,058,041 | A * | 5/2000 | Golke et al. | 365/156 |
| 6,180,984 | B1 * | 1/2001 | Golke et al. | 257/347 |
| 6,285,580 | B1 * | 9/2001 | Phan et al. | 365/156 |
| 6,775,178 | B2 | 8/2004 | Liu | 365/154 |
| 6,822,894 | B1 | 11/2004 | Costello et al. | 365/154 |
| 2003/0107913 | A1 | 6/2003 | Nii | 365/154 |

FOREIGN PATENT DOCUMENTS

| | | | |
|---|---|---|---|
| EP | 1 482 514 | A | 1/2004 |

OTHER PUBLICATIONS

International Search Report for PCT/US2006/002339 dated Jun. 13, 2006.

* cited by examiner

*Primary Examiner*—Son L. Mai
(74) *Attorney, Agent, or Firm*—McDonnell Boehnen Hulbert & Berghoff LLP

(57) ABSTRACT

A method and system is disclosed for preventing write errors in a Single Event Upset (SEU) hardened static random access memory (SRAM) cell. A compensating element has been connected to a feedback path of the SRAM cell. The compensating element operates to cancel out capacitive coupling generated in an active delay element of the SRAM cell. If the compensating element sufficiently cancels the effects of the capacitive coupling, a write error will not occur in the SRAM cell. The compensating element also occupies a smaller silicon area than other proposed solutions.

20 Claims, 5 Drawing Sheets

RADIATION-HARDENED SRAM CELL WITH WRITE ERROR PROTECTION

FIELD

The present invention relates generally to semiconductor storage devices, and more specifically, relates to SRAM memory cells.

BACKGROUND

A memory, such as a static random access memory (SRAM), typically comprises a plurality of memory cells each of which stores a bit of information. A memory cell 100 that is typically used in an SRAM is depicted in FIG. 1. The memory cell 100 is a six transistor cell and includes a first inverter 102 and a second inverter 104. The first inverter 102 includes MOSFETs 106 and 108, and the second inverter 104 includes MOSFETs 110 and 112.

The source terminals of the MOSFETs 106 and 110 are connected to a source VSS, and the source terminals of the MOSFETs 108 and 112 are connected to a supply VDD. The first and second inverters 102 and 104 are cross coupled. Accordingly, the gate terminals of the MOSFETs 106 and 108 are connected to the drain terminals of the MOSFETs 110 and 112, and the gate terminals of the MOSFETs 110 and 112 are connected to the drain terminals of the MOSFETs 106 and 108.

A first transmission gate 114, also known as a pass gate, includes a MOSFET having a first source/drain terminal connected to the drain terminals of the MOSFETs 106 108, a second source/drain terminal connected to a bit line BL, and a gate terminal connected to a non-inverted word line WL. Also, a second transmission gate 116, or pass gate, includes a MOSFET having a first source/drain terminal connected to the drain terminals of the MOSFETs 110 and 112, a second source/drain terminal connected to an inverted bit line NBL, and a gate terminal connected to the non-inverted word line WL.

Each memory cell within the SRAM may be vulnerable to high-energy particles from a radiation harsh environment. These high-energy particles may cause a Single Upset Event (SEU) in a memory cell, which is a change in the stored state of the memory cell. The SEU may occur when a high-energy particle deposits a charge on a given node within the memory cell. The charge threshold at which the SEU may occur is called the critical charge of the memory cell.

Heavy ions are typically considered the dominating cause for SEUs. Heavy ions may be capable of depositing relatively large amounts of charge on a memory cell node. The large deposited charge may force the memory cell node from its original state to an opposite state for some period of time. If the memory cell node is held in the opposite state for a period longer than the delay around the memory cell feedback loop, the memory cell will switch states and the data will be lost.

In addition, protons and neutrons may also cause SEUs. Protons and neutrons typically do not deposit enough charge on a memory cell node to cause an SEU, but protons or neutrons may interact with a Si nuclei of the SRAM. The interaction between the protons or neutrons and the Si nuclei may create secondary high-energy particles, which are also known as recoiling heavy ions. The recoiling heavy ions may be able to travel through a Si lattice and reach the memory cell node. If the recoiling heavy ion does reach the memory cell node, the recoiling heavy ion may cause a SEU under certain conditions.

Many design techniques for reducing the sensitivity of SRAM cells to SEUs caused by high energy particles have been proposed previously. One common design technique to make an SRAM cell more SEU hardened is to add an active delay element between the cross coupled inverters of the SRAM cell. A memory cell 200 with a cross-connected active delay element is depicted in FIG. 2. The memory cell 200 is substantially the same as the memory cell 100 in FIG. 1, except that first and second inverters 202 and 204 are cross-connected through an active delay element 218. Accordingly, the gate terminals of MOSFETs 206 and 208 are connected directly to the drain terminals of the MOSFETs 210 and 212, and the gate terminals of the MOSFETs 210 and 212 are connected to the drain terminals of the MOSFETs 206 and 208 through the active delay element 218.

The active delay element 218 may include a switch transistor. The switch transistor may take various forms. For example, the switch transistor may be a single enhancement-mode NMOSFET, or the switch transistor may be a single enhancement-mode PMOSFET. The gate of the switch transistor may be connected to a word line, and the switch transistor may be turned on during a write operation to improve write performance. The active delay element 218 may also include additional components, such as leaky diodes or resistors connected in parallel with the switch transistor.

The addition of the active delay element 218 is beneficial because it may add delay to the feedback path through the inverters 202 and 204. The increased feedback delay may give a data state holding transistor of the inverters 202 and 204 time to remove a charge deposited by high energy particles before the feedback is completed. If the data state holding transistor removes the deposited charge before the feedback is completed, the SEU may be avoided. Thus, the addition of the active delay element 218 may improve the SEU hardness of the memory cell 200. Further, the active delay element 218 may not substantially increase the write time of the memory cell 200 during dynamic mode.

However, there may also be disadvantages to the addition of the active delay element 218 to the memory cell 200. One disadvantage is that capacitive coupling generated in the active delay element 218 may disturb write data that passes through the active delay element 218 during a write operation. The capacitive coupling may be generated in the switch transistor of the active delay element 218, or may be generated in the leaky diode of the active delay element 218. If the capacitive coupling of the active delay element 218 sufficiently alters the voltage potential of the write data at the output of the active delay element 218, the inverter 204 may switch back to its original state, and a write error will occur.

FIG. 3 illustrates how a write error may occur in memory cell 200 when the active delay element 218 includes a NMOSFET switch transistor with its gate connected to the non-inverted word line WL. FIG. 3 depicts the voltage potential during a write operation for the bit line BL, the word line WL, the input of the active delay element 218 (BIT), the output of the active delay element 218 (BITISO), and the output of the inverter 204 (NBIT). Typically, a "1" may be written in the memory cell 200 that is holding a "0" by raising both the non-inverted bit line BL and the word line WL to a "1" and pulling the inverted bit line NBL to a "0."

A "write 1" operation is initialized in FIG. 3 at time t0. As shown in the Figure, BIT is set to "1" and NBIT is set to "0" at time t0. The "1" at BIT is then passed through the active delay element 218, causing BITISO to transition from "0" to a degraded "1" between time t0 and time t1. However, the capacitive coupling in the active delay element 218 may disturb the voltage potential of BITISO at time t1, when the non-inverted word line WL transitions from "1" back to "0." As shown in the Figure, the capacitive coupling in the active delay element 218 may drop the voltage potential of BITISO below the switch point of the inverter 204. Accordingly, when the write operation is complete at time t1, NBIT will switch back to "1," BIT will be driven back to "0," and a "1" will not be written to memory cell 200.

A similar problem may occur when the active delay element 218 includes a PMOSFET switch transistor with its gate connected to an inverted word line, and a "write 0" operation is initialized. Further, as SRAM cells become more scalable and the source VDD decreases, write errors may become more prevalent as a result of smaller write margins. Accordingly, there is a need for a SRAM cell that prevents write errors caused by capacitive coupling in an active delay element.

SUMMARY

A static random access memory (SRAM) cell is described. The SRAM cell may include a first inverter having an input and an output, a second inverter having an input and an output, an active delay element, and a compensating element. The SRAM cell may also include a first and second transmission gate, a non-inverted bit line, an inverted bit line, a non-inverted word line, and an inverted word line.

The input of the first inverter may be connected directly to the output of the second inverter, and the input of the second inverter may be connected to the output of the first inverter through the active delay element. The compensating element may be connected to the input of the second inverter. Further, the first transmission gate may be connected to the output of the first inverter, the second transmission gate may be connected to the output of the second inverter, the non-inverted bit line may be connected to the first transmission gate, the inverted bit line may be connected to the second transmission gate, and the non-inverted word line may be connected to the first and second transmission gates. Further yet, the non-inverted word line may also be connected to the active delay element and the inverted word line may be connected to the compensating element. Alternatively, the non-inverted word line may also be connected to the compensating element and the inverted word line may be connected to the active delay element.

The active delay element may include a switch transistor and a first and second diode. The gate of the switch transistor may be connected to the non-inverted word line, or may be connected to the inverted word line. For example, the switch transistor may be an enhancement-mode NMOSFET with its gate connected to the non-inverted word line, or the switch transistor may be an enhancement-mode PMOSFET with its gate connected to the inverted word line. A positive terminal of the first diode may be connected to the body of the switch transistor and a negative terminal of the first diode may be connected to the drain of the switch transistor. Similarly, a positive terminal of the second diode may be connected to the body of the switch transistor and a negative terminal of the second diode may be connected to the source of the switch transistor.

The compensating element may be a capacitor. A first plate of the capacitor may be connected to the input of the second inverter, and a second plate of the capacitor may be connected to either the inverted word line or the non-inverted word line, depending on the connections of the active delay element. For example, if the active delay element is connected to the non-inverted word line, then the second plate of the capacitor is connected to the inverted word line. Alternatively, if the active delay element is connected to the inverted word line, then the second capacitor is connected to the non-inverted word line.

More specifically, the compensating element may be a MOSFET capacitor. A gate of the MOSFET capacitor may be connected to the input of the second inverter, and a source, drain, and body of the MOSFET capacitor may be connected to either the inverted word line or the non-inverted word line, depending on the connections of the active delay element. For example, if the active delay element is connected to the non-inverted word line, then the source, drain, and body of the MOSFET capacitor are connected to the inverted word line. Alternatively, if the active delay element is connected to the inverted word line, then the source, drain, and body of the MOSFET capacitor are connected to the non-inverted word line.

One benefit of the SRAM cell described above is that the SRAM cell may prevent write errors caused by capacitive coupling in the active delay element, because the compensating element of the SRAM cell may operate to cancel out the capacitive coupling. Another benefit of the SRAM cell described above is that the compensating element may occupy a smaller silicon area than other solutions proposed to prevent write errors caused by capacitive coupling of the active delay element, because the compensating element may be designed to minimize area penalty.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
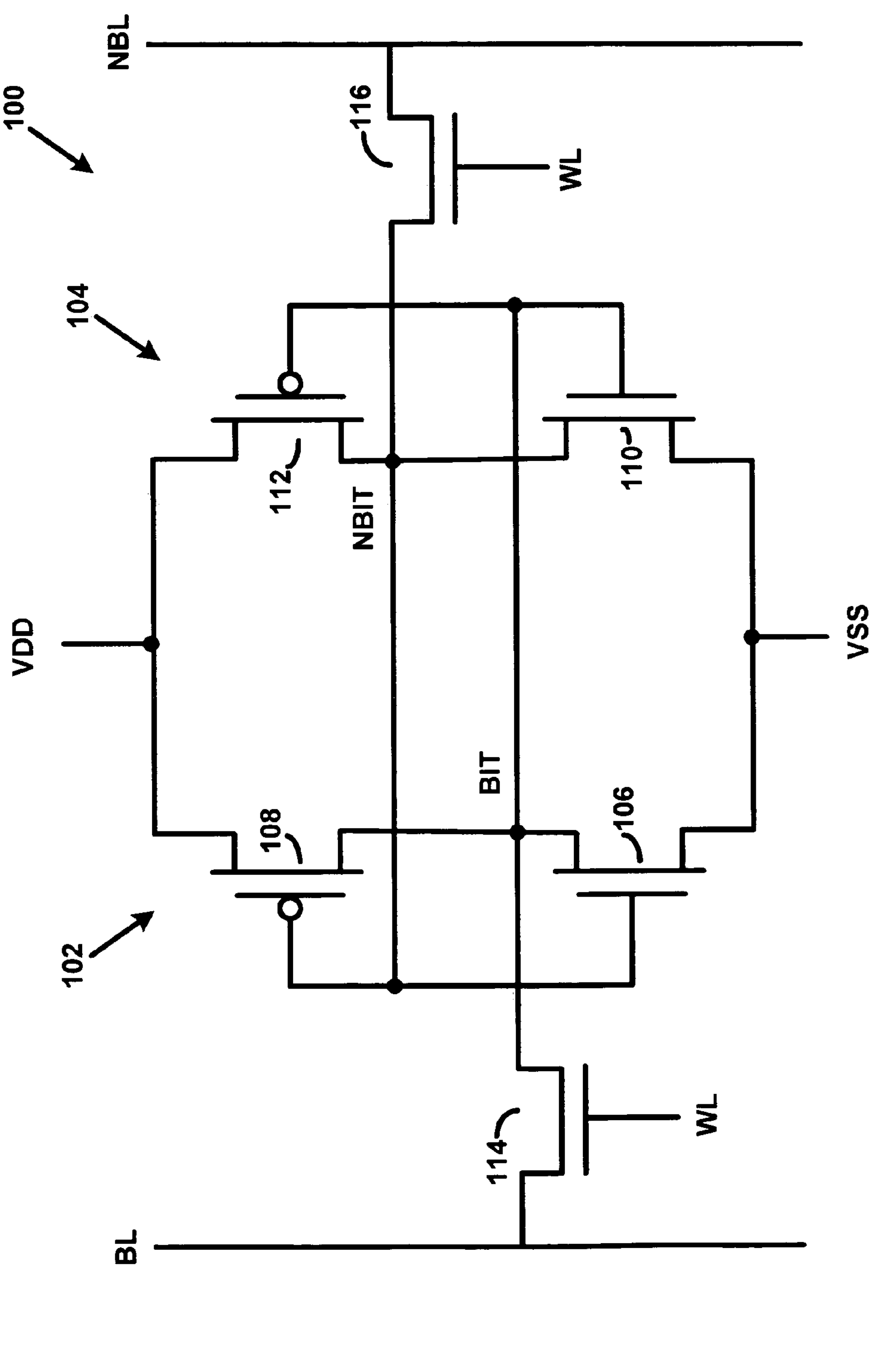
FIG. 1 is a schematic diagram of a first prior art memory cell.
Figure 2:
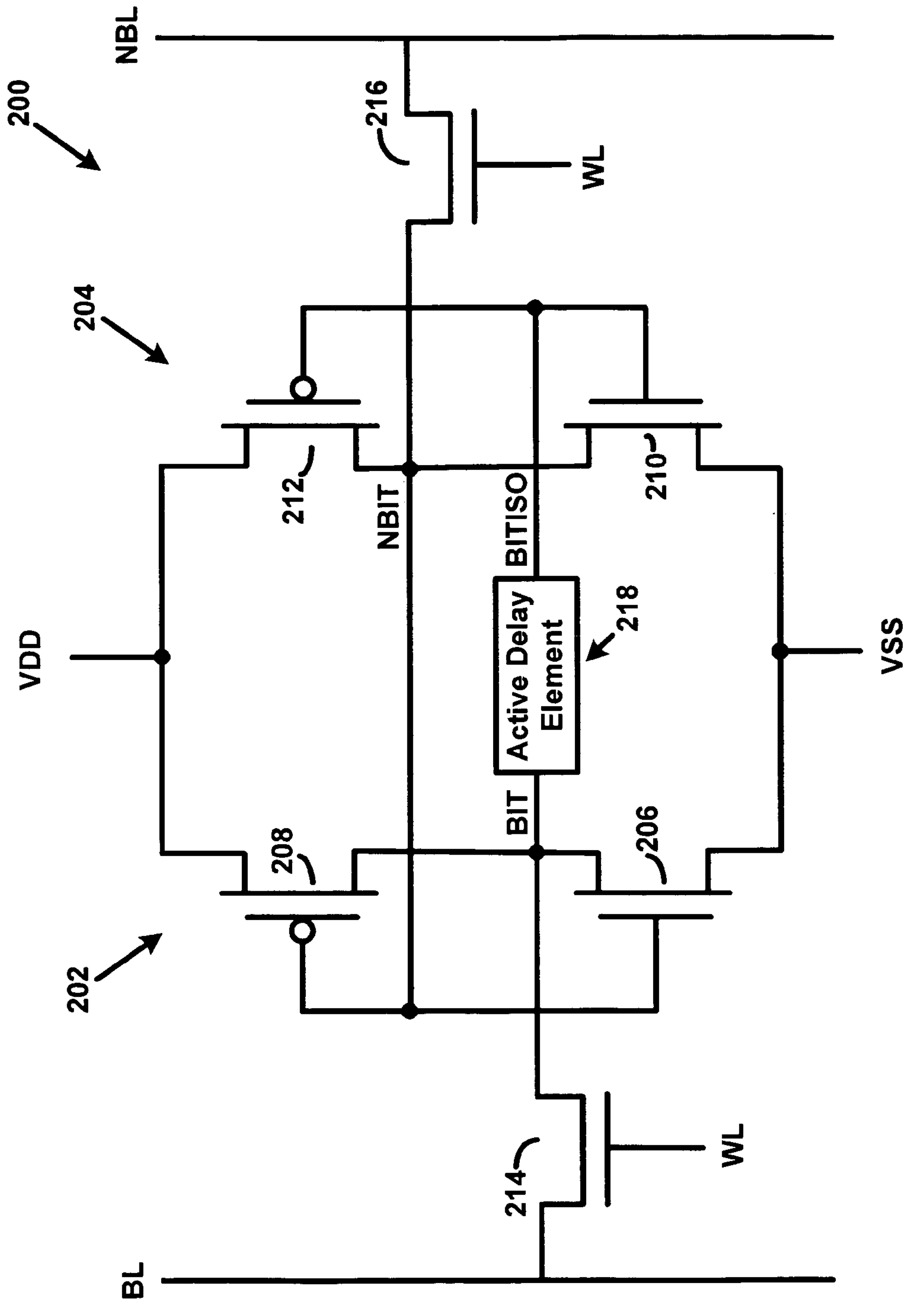
FIG. 2 is a schematic diagram of a second prior art memory cell.
Figure 3:
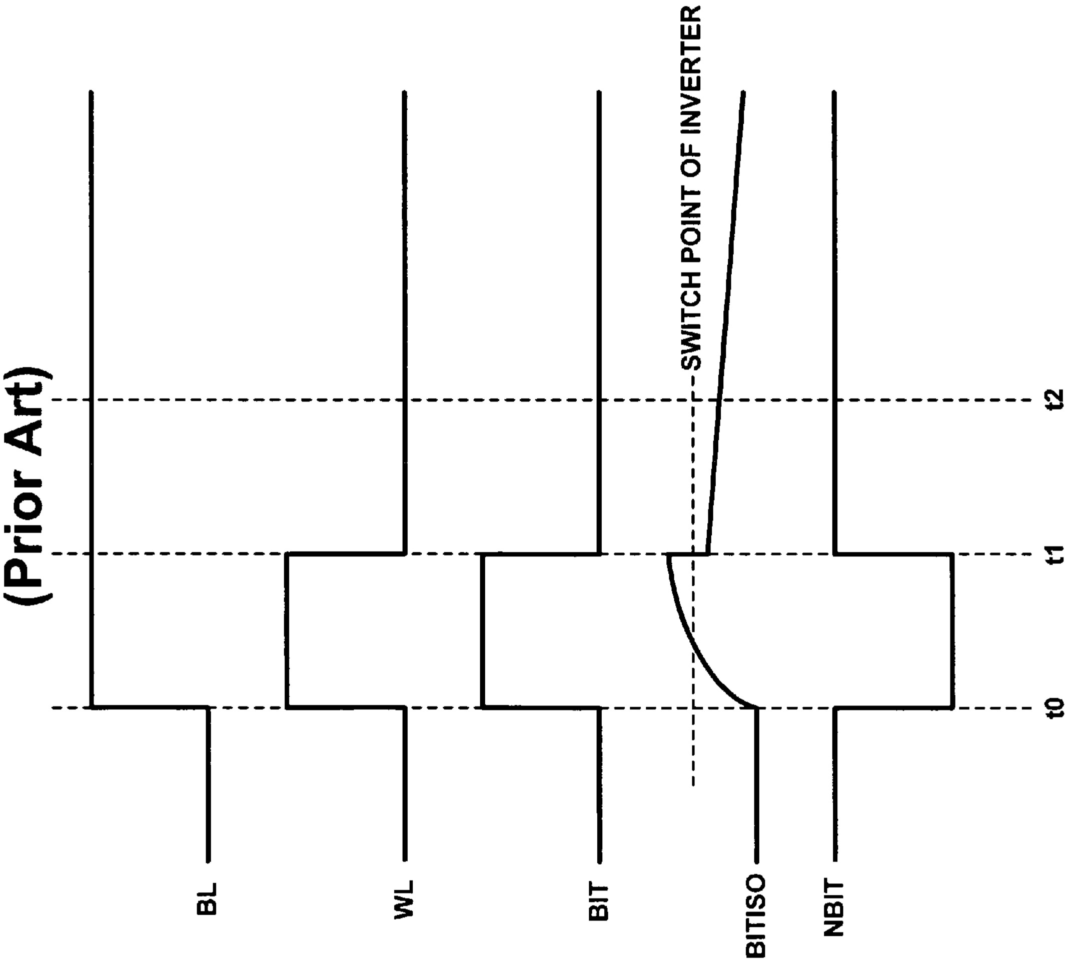
FIG. 3 is a graph of voltage potential in the memory cell depicted in FIG. 2 during a write operation.
Figure 4:
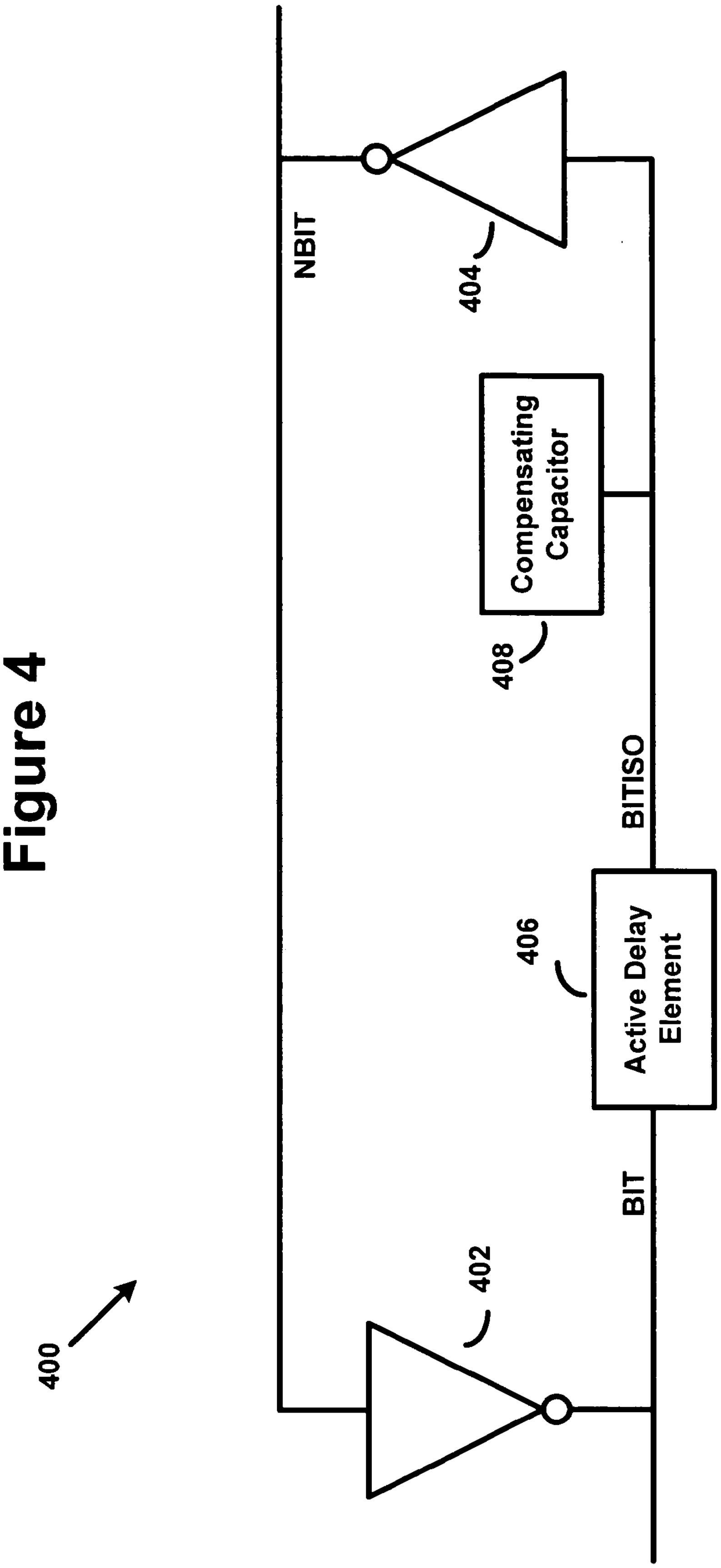
FIG. 4 is a schematic diagram of a memory cell according to an embodiment of the present invention.

A memory cell 400 according to an embodiment of the present invention is shown in FIG. 4. The memory cell 400 may include a first inverter 402, a second inverter 404, an active delay element 406, and a compensating element 408. The inverters 402 and 404 may be cross coupled. Accordingly, the output of the second inverter 404 may be connected directly to the input of the first inverter, and the output of the first inverter 402 may connected to the input of the second inverter 404 through the active delay element 406. Further, the compensating element 408 may be connected to the input of the second inverter 404. The compensating element 408 may operate to prevent a write error in the memory cell 400, as described below.

Figure 5:
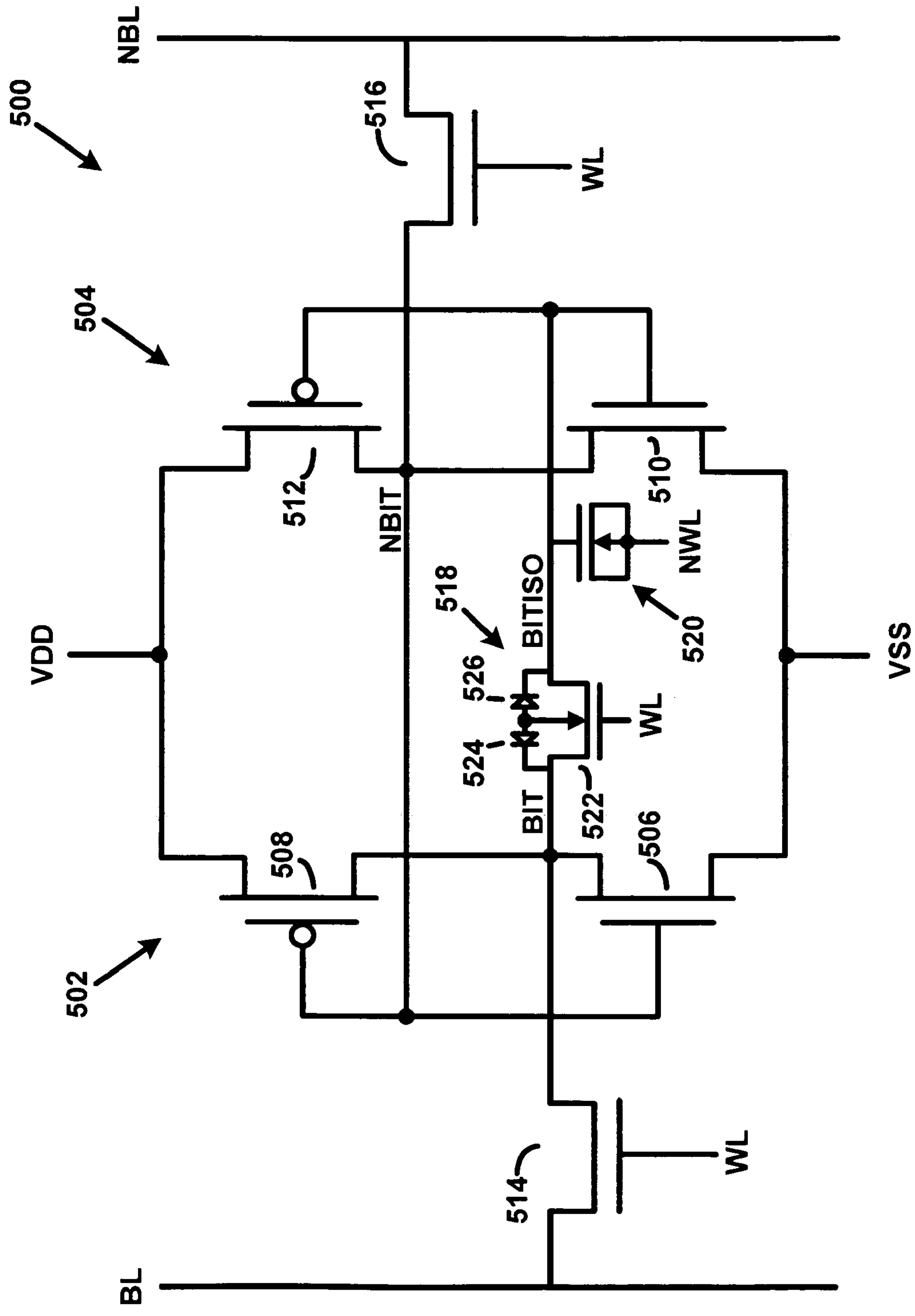
FIG. 5 is a schematic diagram of a complimentary metal-oxide semiconductor (CMOS) implementation of a memory cell according to an embodiment of the present invention.

A complimentary metal-oxide semiconductor (CMOS) implementation of a memory cell 500 according to an embodiment of the present invention is shown in FIG. 5. The memory cell 500 may include a first inverter 502, a second inverter 504, an active delay element 518, and a compensating element 520. In addition, the memory cell 500 may also include a first transmission gate 514, a second transmission gate 516, a non-inverted bit line BL, an inverted bit line NBL, a non-inverted word line WL, and an inverter word line NWL.

The first inverter 502 may include MOSFETs 506 and 508, and the second inverter 504 may include MOSFETs 510 and 512. The source terminals of the MOSFETs 506 and 510 may be connected to a source VSS, and the source terminals of the MOSFETs 508 and 512 may be connected to a supply VDD. The first and second inverters 502 and 504 may be cross coupled. Accordingly, the gate terminals of the MOSFETs 506 and 508 may be connected directly to the drain terminals of the MOSFETs 510 and 512, and the gate terminals of the MOSFETs 510 and 512 may be connected to the drain terminals of the MOSFETs 506 and 508 through the active delay element 518.

The compensating element 520 may be connected to the input of the second inverter 504. Accordingly, the compensating element 520 may be connected to the gate terminals of the MOSFETs 510 and 512. Further, one of the active delay element 518 and compensating element 520 may be connected to the non-inverted word line WL and one of the active delay element 518 and compensating element 520 may be connected to the inverted word line NWL, as described below.

The first transmission gate 514, also known as a pass gate, may include a MOSFET having a first source/drain terminal connected to the drain terminals of the MOSFETs 506 and 508, a second source/drain terminal connected to the bit line BL, and a gate terminal connected to the non-inverted word line WL. Also, the second transmission gate 516, or pass gate, may include a MOSFET having a first source/drain terminal connected to the drain terminals of the MOSFETs 510 and 512, a second source/drain terminal connected to the inverted bit line NBL, and a gate terminal connected to the non-inverted word line WL.

The active delay element 518 may include a switch transistor 522 and two leaky diodes 524 and 526. A gate of the switch transistor 522 may be connected to the non-inverted word line WL, or may be connected to the inverted word line NWL. For example, the switch transistor 522 may be a single enhancement-mode NMOSFET with its gate connected to the non-inverted word line WL. Alternatively, the switch transistor 522 may be a single enhancement-mode PMOSFET with its gate connected to the inverted word line NWL. Other switch transistors 522 are also possible as well. The two leaky diodes 524 and 526 are preferably connected back-to-back and placed in parallel with the switch transistor 522. Accordingly, the first diode 524 may be connected between the body and drain of the switch transistor 522, and the second diode 526 may be connected between the body and source of the switch transistor 522.

As shown in FIG. 5, the switch transistor 522 may be an enhancement-mode NMOSFET with its gate connected to the non-inverted word line WL. In this configuration, when the non-inverted word line WL is low, there may be no conductance through the switch transistor 522 and state changes in the memory cell 500 have to pass through diode 524 and diode 526. Therefore, as previously described, the deposited charge of high energy particles may be removed before the state of the memory cell is changed, and the sensitivity of memory cell 500 to SEUs may be reduced. Alternatively, when the word line WL is high, the switch transistor 522 may short the diodes 524 and 526, and state changes in the memory cell 500 may pass through the low impedance of the switch transistor 522. The active delay element 518 functions substantially similarly when the switch transistor 522 is an enhancement-mode PMOSFET with its gate connected to the inverted word line NWL. Accordingly, the active delay element 518 may not substantially increase the write time of the memory cell 500.

The compensating element 520 may be a capacitor. A first plate of the capacitor may be connected to the gate terminals of the MOSFETs 510 and 512, and a second plate of the capacitor may be connected to either the inverted word line NWL or the non-inverted word line WL, depending on the connections of the switch transistor 522 in the active delay element 518. For example, if the gate of the switch transistor 522 is connected to the non-inverted word line WL, then the second plate of the capacitor is connected to the inverted word line NWL. Alternatively, if the gate of the switch transistor 522 is connected to the inverted word line NWL, then the second capacitor is connected to the non-inverted word line WL.

More specifically, as shown in FIG. 5, the compensating element 520 may be a MOSFET capacitor. A gate of the MOSFET capacitor may be connected to the gate terminals of the MOSFETs 510 and 512, and a source, drain, and body of the MOSFET capacitor may be connected to either the inverted word line or the non-inverted word line, depending on the connections of the switch transistor 522 in the active delay element 518. For example, if the gate of the switch transistor 522 is connected to the non-inverted word line WL, then the source, drain, and body of the MOSFET capacitor are connected to the inverted word line NWL. Alternatively, if the gate of the switch transistor 522 is connected to the inverted word line NWL, then the source, drain, and body of the MOSFET capacitor are connected to the non-inverted word line WL.

The addition of the compensating element 520 is beneficial because the compensating element 520 may operate to prevent a write error in the memory cell 500. As previously described, capacitive coupling generated in the active delay element 518 may cause a write error. For example, if the switch transistor 522 in the active delay element 518 is an enhancement-type NMOSFET as shown in FIG. 5, then the gate of the NMOSFET is connected to the non-inverted write line WL, the input of the NMOSFET is connected to the output of the first inverter 502, and the output of the NMOSFET is connected to the input of the second inverter 504. Therefore, when a "write 1" operation is initialized, the non-inverted word line WL and the non-inverted bit line BL transition to "1" and the inverted bit line NBL transitions to "0," forcing the gate and the input of the NMOSFET to "1." After a short time, the "1" at the input of the NMOSFET will then pass through the NMOSFET and cause the output of the NMOSFET to transition from "0" to a degraded "1". Then, when the write operation is complete, the word line WL will transition from "1" back to "0," forcing the gate of the NMOSFET back to "0." In turn, the capacitive coupling through the NMOSFET will cause the voltage potential at the output of the NMOSFET, and the input of the second inverter 504, to decrease. If the voltage potential at the input of the second inverter 504 drops below the switch point of the second inverter 504, a write error may occur in the memory cell 500.

However, the compensating element 520 may prevent this write error by canceling out the capacitive coupling of the active delay element 518. For example, if the compensating element 520 is a MOSFET capacitor as shown in FIG. 5, then the gate of the MOSFET capacitor is connected to the input of the second inverter 504, and the drain, source, and body of the MOSFET capacitor are connected to the inverted word line NWL. Therefore, when a write operation is completed in the memory cell 500, the inverted word line NWL will transition from “0” back to “1,” forcing the drain, source, and body of the MOSFET capacitor to “1.” In turn, the capacitive coupling through the MOSFET capacitor will cause the voltage potential at the gate of the MOSFET capacitor, and the input of the second inverter 504, to increase. This increased voltage potential at the input of the second inverter 504 caused by the MOSFET capacitor may cancel out the decreased voltage potential caused by the capacitive coupling in the NMOSFET switch transistor 522. Accordingly, the compensating element 520 may prevent a write error.

The compensating element 520 may also prevent a write error in the memory cell 500 if the switch transistor 522 in is an enhancement-type PMOSFET. In this example, the compensating element 520 may still be a MOSFET capacitor, but the drain, source, and body of the MOSFET capacitor are now connected to the non-inverted word line WL because the gate of the PMOSFET switch transistor 522 is connected to the inverted write line NWL. Therefore, when a “write 0” operation is completed in the memory cell 500, the capacitive coupling in the PMOSFET switch transistor 522 may cause the voltage potential at the input of the second inverter 504 to increase, and the MOSFET capacitor may cause the voltage potential at the input of the second inverter 504 to decrease. If the decreased voltage potential caused by the MOSFET capacitor sufficiently cancels the increased voltage potential caused by the capacitive coupling of the PMOSFET switch transistor 522, a write error may be prevented.

The addition of the compensating element 520 is also beneficial because the compensating element 520 may occupy a smaller silicon area than other solutions proposed to prevent write errors caused by the capacitive coupling in the active delay element 518. For example, the compensating element 520 may occupy a substantially smaller silicon area than a full transmission gate added across the active delay element 518. Further, the memory cell 500 with the compensating element 520 may be designed to minimize silicon area penalty.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A static random access memory (SRAM) cell comprising:

a first inverter having an input and an output;

a second inverter having an input and an output;

an active delay element; and a compensating capacitance;

wherein the input of the first inverter is connected directly to the output of the second inverter;

wherein the input of the second inverter is connected to the output of the first inverter through the active delay element; and wherein the compensating capacitance is connected to the input of the second inverter.

2. The SRAM cell of claim 1, wherein one of the active delay element and the compensating capacitance is connected to a non-inverted word line and one of the active delay element and the compensating element capacitance is connected to an inverted word line.

3. The SRAM cell of claim 1, further comprising:

a first and second transmission gate;

a non-inverted bit line;

an inverted bit line;

a non-inverted word line; and an inverted word line;

wherein the first transmission gate is connected to the output of the first inverter and the second transmission gate is connected to the output of the second inverter;

wherein the non-inverted bit line is connected to the first transmission gate;

wherein the inverted bit line is connected to the second transmission gate;

wherein the non-inverted word line is connected to the first and second transmission gates and one of the active delay element and the compensating capacitance; and wherein the inverted word line is connected to one of the active delay element and the compensating capacitance.

4. The SRAM cell of claim 1, wherein the active delay element comprises:

a switch transistor having a gate, a source, a drain, and a body; and a first and second diode each having a positive terminal and a negative terminal;

wherein the positive terminal of the first diode is connected to the body of the switch transistor and the negative terminal of the first diode is connected to the drain of the switch transistor, and wherein the positive terminal of the second diode is connected to the body of the switch transistor and the negative terminal of the second diode is connected to the source of the switch transistor.

5. The SRAM veil of claim 4, wherein the gate of the switch transistor is connected to a non-inverted word line.

6. The SRAM cell of claim 4, wherein the gate of the switch transistor is connected to an inverted word line.

7. The SRAM cell of claim 4, wherein the switch transistor comprises an enhancement-mode NMOSFET with its gate connected to a non-inverted word line.

8. The SRAM cell of claim 4, wherein the switch transistor comprises an enhancement-mode PMOSFET with its gate connected to an inverted word line.

9. The SRAM cell of claim 1, wherein the compensating capacitance comprises a capacitor having a first plate and a second plate, wherein the first plate of the capacitor is connected to the input of the second inverter, wherein one of the active delay element and the second plate of the capacitor is connected to a non-inverted word line, and wherein one of the active delay element and the second plate of the capacitor is connected to an inverted word line.

10. The SRAM cell of claim 1, wherein the compensating capacitance comprises a MOSFET capacitor having a gate, a source, a drain, and a body, wherein the gate of the MOSFET capacitor is connected to the input of the second inverter, wherein one of the active delay element and the source, drain, and body of the MOSFET capacitor is connected to a non-inverted word line, and wherein one of the active delay element and the source, drain, and body of the MOSFET capacitor is connected to an inverted word line.

11. A static random access memory (SRAM) cell comprising:

first, second, third, fourth, fifth, and sixth MOSFETs each having a gate, a source, and a drain;

an enhancement-mode NMOSFET having a gate, a source, a drain, and a body;

a MOSFET capacitor having a gate, a source, a drain, and a body;

first and second diodes each having a positive terminal and a negative terminal;

a non-inverted bit line;

an inverted bit line;

a non-inverted word line; and an inverted word line;

wherein the gates of the third and fourth MOSFETs are connected together;

wherein the gates of the fifth and sixth MOSFETs are connected together;

wherein the sources of the third and fifth MOSFETs are connected together;

wherein the sources of the fourth and sixth MOSFETs are connected together;

wherein the drains of the third and fourth MOSFETs are connected together;

wherein the drains of the fifth and sixth MOSFETs are connected together;

wherein the positive terminal of the first diode is connected to the body of the enhancement-mode NMOSFET and the negative terminal of the first diode is connected to the drain of the enhancement-mode NMOSFET;

wherein the positive terminal of the second diode is connected to the body of the enhancement-mode NMQSFET and the negative terminal of the second diode is connected to the source of the enhancement-mode NMOSFET;

wherein the gates of the third and fourth MOSFETs are connected directly to the drains of the fifth and sixth MOSFETs;

wherein the gates of the fifth and sixth MOSFETs are connected to the drains of the third and fourth MOSFETs through the source and drain of the enhancement-mode NMOSFET;

wherein the gate of the MOSFET capacitor is connected to the gates of the fifth and sixth MOSFETs;

wherein one of the source and drain of the first MOSFET is connected to the drains of the third and fourth MOSFETs and one of the source and drain of the first MOSFET is connected to the non-inverted bit line;

wherein one of the source and drain of the second MOSFET is connected to drains of the fifth and sixth MOSFETs and one of the source and drain of the second MOSFET is connected to the inverted bit line;

wherein the gates of the first and second MOSFETs and the gate of the enhancement-mode NMQSFET are connected to the non-inverted word line; and wherein the source, drain, and body of the MOSFET capacitor are connected to the inverted word line.

12. A method for preventing a write error in a static random access memory (SRAM) cell with a first and second inverter, wherein an input of the first inverted is connected directly to an output of the second inverter, and wherein an output of the first inverter is connected to an input of the second inverter trough an active delay element, comprising connecting a compensating capacitance to the input of the second inverter.

13. The method of claim 12, further comprising:

connecting one of the active delay element and the compensating capacitance to a non-inverted word line; and connecting one of the active delay element and the compensating capacitance to an inverted word line.

14. The method of claim 12, wherein the compensating capacitance comprises a capacitor having a first plate and a second plate, and wherein the first plate of the capacitor is connected to the input of the second inverter, further comprising:

connecting one of the active delay element and the second plate of the capacitor to a non-inverted word line; and connecting one of the active delay element and the second plate of the capacitor to an inverted word line.

15. The method of claim 12, wherein the compensating capacitance comprises a MOSFET capacitor having a gate, a source, a drain, and a body, and wherein the gate of the MOSFET capacitor is connected to the input of the second inverter, further comprising:

connecting one of the active delay element and the source, drain, and body of the MOSFET capacitor to a non-inverted word line; and connecting one of the active delay element and the source, drain, and body of the MOSFET capacitor to an inverted word line.

16. A static random access memory (SRAM) cell comprising:

a first inverter having an input and an output;

a second inverter having an input and an output;

an active delay element; and a write error protection element;

wherein the input of the first inverter is connected directly to the output of the second inverter;

wherein the input of the second inverter is connected to the output of the first inverter through the active delay element; and wherein the write error protection element is connected to the input of the second inverter.

17. The SRAM cell of claim 16, wherein one of the active delay element and the write error protection element is connected to a non-inverted word line and one of the active delay element and the write error protection element is connected to an inverted word line.

18. The SRAM cell of claim 16. further comprising:

a first and second transmission gate;

a non-inverted bit line;

an inverted bit line;

a non-inverted word line; and an inverted word line;

wherein the first transmission gate is connected to the output of the first inverter and the second transmission gate is connected to the output of the second inverter;

wherein the non-inverted bit line is connected to the first transmission gate;

wherein the inverted bit line is connected to the second transmission gate;

wherein the non-inverted word line is connected to the first and second transmission gates and one of the active delay element and the write error protection element; and wherein the inverted word line is connected to one of the active delay element and the write error protection element.

19. The SRAM cell of claim 16, wherein the write error protection element comprises a capacitor having a first plate and a second plate, wherein the first plate of the capacitor is connected to the input of the second inverter, wherein one of the active delay element and the second plate of the capacitor is connected to a non-inverted word line, and wherein one of the active delay element and the second plate of the capacitor is connected to an inverted word line.

20. The SRAM cell of claim 16, wherein the write error protection element comprises a MOSFET capacitor having a gate a source, a drain, and a body, wherein the gate of the MOSFET capacitor is connected to the input of the second inverter, wherein one of the active delay element and the source, drain, and body of the MOSFET capacitor is connected to a non-inverted word line, and wherein one of the active delay element and the source, drain, and body of the MOSFET capacitor is connected to an inverted word line.

* * * * *

UNITED STATES PATENT AND TRADEMARK OFFICE

CERTIFICATE OF CORRECTION

PATENT NO. : 7,233,518 B2
APPLICATION NO. : 11/051916
DATED : June 19, 2007
INVENTOR(S) : Harry Liu It is certified that error appears in the above-identified patent and that said Letters Patent is hereby corrected as shown below:

In Claim 5, replace “The SRAM veil” with --The SRAM cell--

In Claim 11, replace “enhancement-mode NMQSFET” with --enhancement-mode NMOSFET--

In Claim 12, replace “the second inverter trough an” with --the second inverter through--

Signed and Sealed this

Twenty-seventh Day of November, 2007

JON W. DUDAS

*Director of the United States Patent and Trademark Office*